United States Patent [19]

Parle et al.

[11] Patent Number: 5,498,985
[45] Date of Patent: Mar. 12, 1996

[54] DUAL COMPARATOR TRIGGER CIRCUIT FOR GLITCH CAPTURE

[75] Inventors: Jonathan J. Parle, Seattle; Martins Skele, Langley, both of Wash.

[73] Assignee: Fluke Corporation, Everett, Wash.

[21] Appl. No.: 199,034

[22] Filed: Feb. 17, 1994

[51] Int. Cl.⁶ .......................... H03K 5/153; H03K 12/00
[52] U.S. Cl. ................... 327/74; 327/76; 327/184
[58] Field of Search .................. 327/64, 68–70, 327/74–79, 205, 184, 164, 551, 559

[56] References Cited

U.S. PATENT DOCUMENTS

| | | | |
|---|---|---|---|
| 3,683,284 | 8/1972 | Mueller | 327/74 |
| 4,382,198 | 5/1983 | Ishijima et al. | 327/74 |
| 4,504,975 | 3/1985 | Jarret et al. | 327/76 |
| 4,859,872 | 8/1989 | Hyakutake | 327/74 |
| 5,097,147 | 3/1992 | Stuebing et al. | 327/74 |
| 5,210,527 | 5/1993 | Smith et al. | 327/76 |

Primary Examiner—Toan Tran

[57] ABSTRACT

A glitch trigger circuit for measuring glitches that appear on power line signals includes two comparators and two independently controllable voltage trigger levels to allow proper trigger on glitches of unknown polarity. A high pass filter rejects the power line signal while passing the glitch signals to provide triggering on glitches with voltage amplitudes less than the voltage amplitude of the power line signal.

3 Claims, 2 Drawing Sheets

DUAL COMPARATOR TRIGGER CIRCUIT FOR GLITCH CAPTURE

BACKGROUND OF THE INVENTION

This invention relates generally to trigger circuits and in particular to a trigger circuit utilizing two comparators for generating a trigger signal in response to a fast electrical pulse commonly known as a glitch.

Measuring an electrical signal with an instrument such as a digital storage oscilloscope often requires obtaining a trigger signal to synchronize the measurement process with the event of interest. Such a trigger signal is usually generated by a separate internal trigger circuit in the instrument to initiate the instrument measurement sequence.

Triggering on a periodic waveform such as a sinusoidal 60 hertz electrical power line signal is easily done with a single comparator trigger circuit which generates a trigger circuit in response to the input signal voltage passing through a selected trigger voltage reference level. Choosing an appropriate trigger point on the power line signal is a matter of selecting an appropriate trigger voltage level.

Glitches are transient voltage waveforms that do not occur periodically. Glitches can be caused by random events, such as a lightning stroke or a switch closure. Glitch signals may be in the form of positive transient voltages, negative transient voltages, or bipolar (both positive and negative) transient voltages, depending on how they were generated. A trigger circuit is often necessary to synchronize the measurement equipment to the occurrence of the glitch since the glitch duration is often very short and its time of occurrence is not predictable. Assuming the type of glitch is known, a single comparator trigger circuit programmed with the proper trigger voltage level will allow an appropriate trigger signal to be generated, synchronizing the instrument measurement sequence with the desired transient event to be measured.

A common measurement task is to evaluate power line signals for noise superimposed on the power line signal by measuring the glitches as they occur. The periodic power line signal is combined with the nonperiodic glitch signal. Successfully measuring the glitch signal requires having a trigger signal responsive to the glitch signals in order to synchronize the measurement sequence. However, glitch signals that are superimposed on a sinusoidal signal present a significant problem for conventional trigger circuits when the amplitude of the glitch signal is less than that of the power line signal or the voltage polarity of the glitch is not known. The glitch signal voltage will very likely be masked in the power line signal voltage, thereby foiling a conventional trigger circuit which is responsive only to the input signal passing through a discrete voltage level of the input signal, resulting in a trigger signal that is not responsive to the glitches of interest. It is therefore desirable to have a glitch trigger circuit to provide a trigger signal responsive to glitch signals that are superimposed on sinusoidal power line signals, regardless of whether the glitches are bipolar, positive, or negative polarities and whether the glitch voltage level is less than the power line voltage level.

SUMMARY OF THE INVENTION

In accordance with the present invention, a glitch trigger circuit provides triggering responsive to positive, negative, and bipolar glitch signals that are superimposed on low frequency signals such as power line signals.

A 16 kilohertz high pass filter, which blocks the low frequency power line frequency signal while passing higher frequency glitch signals which are typically in the 100 kilohertz to 1 megahertz range, is disposed between the input signal and the inputs of the two comparators. Two comparators, one inverting and the other noninverting, provide a trigger signal responsive to the filtered input signal with a voltage level that exceeds either of two set trigger voltage limits where one voltage limit is a positive voltage level and other voltage limit is a negative voltage level. A positive reference voltage and a negative voltage reference provide the desired positive and negative voltage trigger limits to the respective inputs of the two comparators. The output trigger signals from the two comparators are combined using an OR-gate to form the glitch trigger output.

One feature of the present invention is to provide triggering responsive to glitch signals superimposed on low frequency (50 Hz to 60 hertz) power line signals regardless of the glitch voltage level relative to the power line signal level.

Another feature of the present invention is to provide dual-level triggering responsive to positive, negative, and bipolar voltage polarity glitches.

Another feature of the present invention is to provide independent control of both the positive voltage trigger level and the negative voltage trigger level.

Other features, attainments, and advantages will become apparent to those skilled in the art upon a reading of the following description when taken in conjunction with the accompanying drawings.

DETAILED DESCRIPTION OF THE INVENTION

Figure 1:
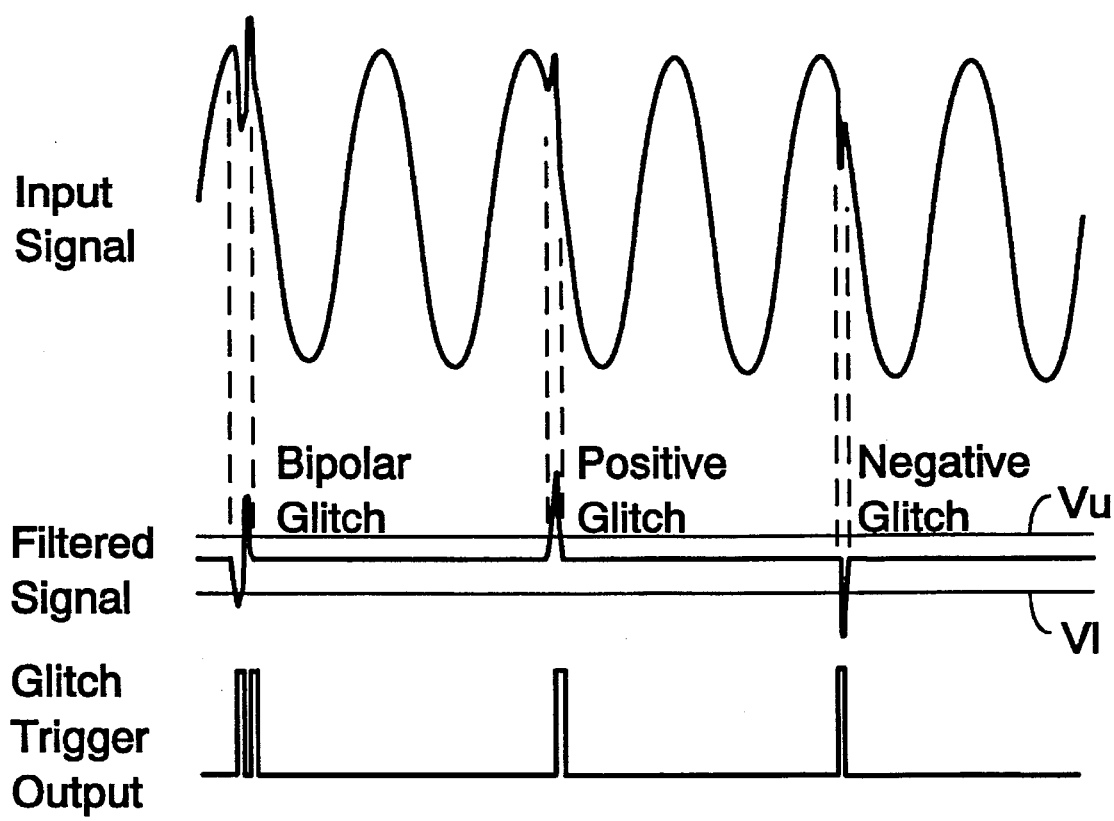
FIG. 1 is a waveform diagram that illustrates the operation of the glitch trigger circuit in accordance with the present invention.

Before discussing detailed circuit operation, an overview of the operation of the glitch trigger circuit in accordance with the present invention will be provided. Referring now to FIG. 1, a power line signal forms the sinusoidal input signal, labeled Input Signal. Superimposed on the power line signal are three possible polarities of glitch signals, labeled Bipolar Glitch, Positive Glitch, and Negative Glitch. Glitches, which are transient voltage waveforms of relatively short duration (1 to 10 microseconds typically), may be positive voltage pulses (Positive Glitch), negative voltage pulses (Negative Glitch), or a combination of positive and a negative voltage pulses (Bipolar Glitch). The Input Signal waveform illustrates that glitches can arrive superimposed on the power line signal with unknown voltage polarity and amplitude, and can occur on any phase of the power line signal.

The high pass filter rejects the power line signal but passes the glitch signals as illustrated with the Filtered Signal waveform. Superimposed on the Filtered Signal waveform are an upper voltage trigger level labeled Vu and a lower voltage trigger level Vl. A trigger pulse is generated for the duration of time that the Filtered Signal waveform exceeds the upper voltage trigger level labeled Vu and or is less than the lower voltage trigger level Vl. The outputs of the comparators are combined to form the output signal labeled Glitch Trigger Output.

Figure 2:
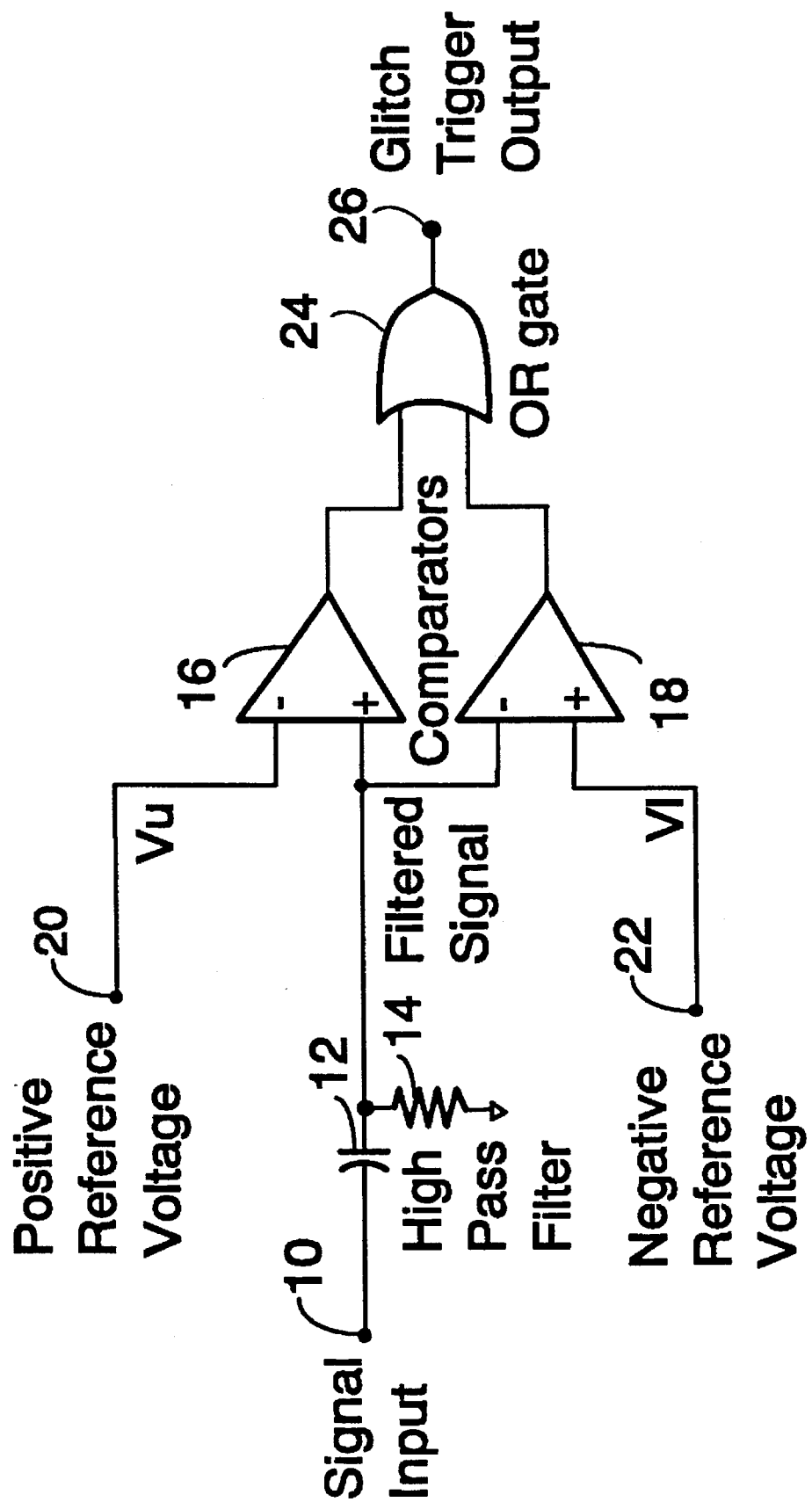
FIG. 2 is a detailed circuit schematic of the preferred embodiment of the present invention.

Referring now to FIG. 2, there is shown the commercial embodiment of the present invention. The input signal is applied to an input terminal 10 labeled Signal Input. The input terminal 10 is connected to the top of a series combination of a capacitor 12 and resistor 14 disposed in series to ground forming a high pass filter with the signal labeled Filtered Signal available at the center tap. In the commercial embodiment, capacitor 12 has a value of 1000 picofarads and resistor 14 has a value of 10,000 Ohms to form a single pole high pass filter with a 16 kilohertz cutoff frequency which rejects low frequency power line signals at input terminal 10 while passing higher frequency glitch signals to form the Filtered Signal. The Filtered Signal is coupled to the non inverting input of a comparator 16 and to the inverting input of a comparator 18. The Positive Reference Voltage is a d.c. (direct current) voltage source coupled to terminal 20 to provide the desired upper voltage limit Vu at the center tap which is coupled to the inverting input of the comparator 16. The Negative Reference Voltage is a d.c. voltage source coupled to terminal 22 to provide the desired lower voltage limit Vl at the center tap which is coupled to the non inverting input of the comparator 18. In the commercial embodiment, the polarity of the upper voltage limit Vu is positive with respect to ground and the polarity of the lower voltage limit Vl is negative with respect to ground. Comparator 16 provides a signal when the Filtered Input signal voltage is above the upper voltage limit Vu. Comparator 18 provides a signal when the Filtered Input signal voltage is below the lower voltage limit Vl. The output of comparator 16 is coupled to an input of an OR-gate 24 and the output of comparator 18 is coupled to another input of the OR-gate 24. The OR-gate 24 is coupled to an output terminal 26 labeled Glitch Trigger Output and provides an output responsive to the output of Comparator 16 and of Comparator 18 to form the output signal.

It will be obvious to those having ordinary skill in the art that many changes may be made in the details of the above described preferred embodiments of the invention without departing from the spirit of the invention in its broader aspects. For example, different filters may be substituted to reject unwanted signals of any frequency distinguishable from the frequency of the desired signal to trigger on. The filter may be removed entirely in the absence of an unwanted signal to obtain dual-level triggering responsive to positive, negative, and bipolar signals. Furthermore, the upper trigger voltage limit and the lower trigger voltage limit can be of the same voltage polarity to provide dual-level triggering responsive to signals that do not have a zero crossing. Therefore, the scope of the present invention should be determined by the following claims.

What I claim as my invention is:

1. A glitch trigger circuit comprising:

(a) a high-pass filter for receiving an input signal and providing a filtered signal;

(b) a fast voltage source for providing an upper limit voltage wherein said upper limit voltage is positive with respect to ground;

(c) a second voltage source for providing a lower limit voltage wherein said lower limit voltage is negative with respect to ground;

(d) a fast comparator having a fast input coupled to said first voltage source and a second input coupled to said high-pass filter to produce an upper limit signal at an output when the voltage of said filtered signal is above said upper limit voltage;

(e) a second comparator having a first input coupled to said second voltage source and a second input coupled to said high-pass filter to produce a lower limit signal at an output when the voltage of said filtered signal is below said lower limit voltage; and (f) a logical OR circuit having a first input coupled to said first comparator output and a second input coupled to said second comparator output, said logical OR circuit responsive to said upper limit signal and said lower limit signal to provide a trigger signal.

2. A glitch trigger circuit in accordance with claim 1 wherein said high-pass filter blocks low frequency power line signals and passes high frequency glitch signals.

3. A glitch trigger circuit for detecting high frequency glitches on low frequency power line signals, comprising:

(a) a high-pass filter for receiving an input signal and providing a filtered signal wherein said filter blocks said low frequency power line signals and passes said high frequency glitch signals;

(b) a first voltage source for providing an upper limit voltage wherein said upper limit voltage is positive with respect to ground;

(c) a second voltage source for providing a lower limit voltage wherein said lower limit voltage is negative with respect to ground;

(d) a first comparator having a first input coupled to said first voltage source and a second input coupled to said high-pass filter to produce an upper limit signal at an output when the voltage of said filtered signal is above said upper limit voltage;

(e) a second comparator having a first input coupled to said second voltage source and a and a second input coupled to said high-pass filter to produce a lower limit signal at an output when the voltage of said filtered signal is below said lower limit voltage; and (f) a logical OR circuit having a first input coupled to said first comparator output and a second input coupled to said second comparator output, said logical OR circuit responsive to said upper limit signal and said lower limit signal to provide a trigger signal.

* * * * *